(12) United States Patent
Huang et al.

(10) Patent No.: US 10,338,160 B2
(45) Date of Patent: Jul. 2, 2019

(54) HIGH-PRECISION IMAGING AND DETECTING DEVICE FOR DETECTING SMALL DEFECT OF PIPELINE BY HELICAL MAGNETIC MATRIX

(71) Applicant: Tsinghua University, Beijing (CN)

(72) Inventors: Songling Huang, Beijing (CN); Wei Zhao, Beijing (CN); Shen Wang, Beijing (CN); Lisha Peng, Beijing (CN); Yu Zhang, Beijing (CN); Xinjie Yu, Beijing (CN); Jun Zou, Beijing (CN); Lin Gui, Beijing (CN); Fuping Wang, Beijing (CN)

(73) Assignee: TSINGHUA UNIVERSITY, Beijing (CN)

( * ) Notice: Subject to any disclaimer, the term of this patent is extended or adjusted under 35 U.S.C. 154(b) by 69 days.

(21) Appl. No.: 15/840,650

(22) Filed: Dec. 13, 2017

(65) Prior Publication Data
US 2019/0004124 A1    Jan. 3, 2019

(30) Foreign Application Priority Data

Jun. 29, 2017   (CN) .......................... 2017 1 0517066

(51) Int. Cl.
  *G01R 33/09* (2006.01)
  *F17D 5/06* (2006.01)
  *G01M 3/40* (2006.01)
(52) U.S. Cl.
  CPC ............. *G01R 33/091* (2013.01); *F17D 5/06* (2013.01); *G01M 3/40* (2013.01)

(58) Field of Classification Search
  CPC ............ G01R 33/09; F17D 5/06; G01M 3/40
  See application file for complete search history.

(56) References Cited

U.S. PATENT DOCUMENTS

| | | | | |
|---|---|---|---|---|
| 6,035,786 A | * | 3/2000 | McKay | F16L 55/28 104/138.1 |
| 2009/0123174 A1 | * | 5/2009 | Iwata | G03G 21/206 399/92 |
| 2011/0280665 A1 | * | 11/2011 | Emmons | F16L 55/1655 405/184.2 |

* cited by examiner

*Primary Examiner* — Jermele M Hollington
*Assistant Examiner* — Alvaro E Fortich
(74) *Attorney, Agent, or Firm* — David D. Brush; Westman, Champlin & Koehler, P.A.

(57) ABSTRACT

A high-precision imaging and detecting device for detecting a small defect of a pipeline by a helical magnetic matrix. The device includes: a helical excitation module including a helical excitation coil; a magnetic matrix detection module, disposed at an inner side of the helical excitation coil and including at least one magnetic sensor group arranged at intervals along an axial direction of the helical excitation coil, group including a plurality of magnetic sensors evenly spaced apart and arranged along a circumferential direction of the helical excitation coil, and the magnetic sensor being configured to detect an induction magnetic field of the pipeline; a signal processing module, connected with the magnetic matrix detection module, and configured to receive, process and output an induction magnetic field signal of the pipeline detected by the magnetic sensor.

8 Claims, 5 Drawing Sheets

HIGH-PRECISION IMAGING AND DETECTING DEVICE FOR DETECTING SMALL DEFECT OF PIPELINE BY HELICAL MAGNETIC MATRIX

FIELD

The present disclosure relates to a field of non-destructive testing (NDT) technology, and more particularly, to a high-precision imaging and detecting device for detecting a small defect of a pipeline by a helical magnetic matrix.

BACKGROUND

Common techniques for detecting pipeline defects include magnetic flux leakage testing, eddy current testing and so on. The magnetic flux leakage testing has relatively high detection precision, but needs a magnetizer during detection, a detection device used has a relatively complicated structure, and the magnetizer (like a permanent magnet) may have an absorption effect on the pipeline, thereby hindering the operation of the detector in the pipeline. The eddy current testing employs an eddy-current coil as an excitation source and has a simpler structure, but it achieves measurement of an eddy current change at a defect through an induction coil, thus obtaining less defect information and only achieving an approximate location of the defect and simple categorization.

In the related art, for example, "Long-distance Pipeline Defect Positioning Method and Positioning System" (ZL200710187426.2) adopts an eddy-current testing device to implement detection of a pipeline defect, but can only determine a location of the pipeline defect without imaging the defect; "In-pipeline Detector Signal Activating and Collecting Device and Pipeline Defect Detection Method" (ZL201410352876.2) provides a device for activating and collecting an in-pipeline detector signal and a method for detecting a pipeline defect, in which the method can only determine the type of the defect, such as an internal defect, an external defect, a crack defect and so on, but cannot perform inversion imaging of the defect. It can be seen that the existing eddy-current testing device has the advantage of simple structure but obtains less defect information, and can hardly achieve high-precision detection and imaging of the pipeline defect based on the insufficient detection information.

SUMMARY

The present disclosure aims to solve at least one of the problems existing in the related art. Accordingly, the present disclosure provides a high-precision imaging and detecting device for detecting a small defect of a pipeline by a helical magnetic matrix. The imaging and detecting device has advantages of a low redundant structure, convenient operation and high detection precision.

The high-precision imaging and detecting device for detecting the small defect of the pipeline by the helical magnetic matrix according to the present disclosure includes: a helical excitation module, including a helical excitation coil, the helical excitation coil being configured to induce an alternating current in the pipeline; a magnetic matrix detection module, disposed at an inner side of the helical excitation coil and including one magnetic sensor group or including a plurality of magnetic sensor groups spaced apart and arranged along an axial direction of the helical excitation coil, each magnetic sensor group including a plurality of magnetic sensors evenly spaced apart and arranged along a circumferential direction of the helical excitation coil, and each magnetic sensor being configured to detect an induction magnetic field of the pipeline; and a signal processing module, connected with the magnetic matrix detection module, and configured to receive, process and output an induction magnetic field signal of the pipeline detected by the magnetic sensor.

For the high-precision imaging and detecting device for detecting the small defect of the pipeline by the helical magnetic matrix according to embodiments of the present disclosure, by adopting the helical excitation coil as an excitation source, the excitation structure is simpler, and the excitation source is controllable and capable of adapting to detection of pipelines with different wall thicknesses, compared with a conventional permanent-magnet magnetizer used for a magnetic flux leakage testing; by utilizing the magnetic sensors in a matrix arrangement in the magnetic matrix detection module to realize detection of the induction magnetic field, compared with conventional coil-type signal acquisition of the eddy-current testing, the defect can be located accurately and imaged based on sufficiently acquired information of the defect, and compared with magnetic signal acquisition of the eddy-current testing—arranging a single or a few magnetic sensors in a center of an eddy-current coil to detect an eddy-current change in the magnetic field, the magnetic sensors in the matrix arrangement adopted in the present disclosure can sufficiently obtain the information about the defect even if the defect is very small, the high-precision imaging and detecting device thus has advantages of a simple structure, convenient operation and high detection precision.

In some embodiments, the signal processing module includes a signal regulation circuit, an analog-to-digital conversion circuit, and an I/O interface circuit, and the signal processing module is configured to perform amplification, filtration, analog-to-digital conversion and signal output of the induction magnetic field signal detected by the magnetic sensor.

In some embodiments, the signal processing module further includes an effective value conversion circuit that is configured to convert a received alternating current signal of the induction magnetic field of the pipeline into a direct current signal by means of an effective value conversion.

In some embodiments, the high-precision imaging and detecting device further includes a circuit board disposed at an inner side of the magnetic matrix detection module, the signal regulation circuit, the analog-to-digital conversion circuit and the I/O interface circuit being integrated on the circuit board.

In some embodiments, one or a plurality of circuit boards are provided, the plurality of circuit boards are spaced apart and arranged along the axial direction of the helical excitation coil, and each circuit board is connected with the magnetic sensor of at least one magnetic sensor group.

In some embodiments, the high-precision imaging and detecting device further includes: a special-purpose computer, connected with the signal processing module and configured to store, analyze, calculate and display the induction magnetic field signal of the pipeline transmitted by the signal processing module; and a signal control module, connected with the helical excitation module, the magnetic matrix detection module, the signal processing module and the special-purpose computer separately, and configured to control an alternating current input into the helical excitation coil, control the number of magnetic sensor groups activated in the magnetic matrix detection module, and control to transmission of a signal of the signal processing module to the special-purpose computer.

In some embodiments, each magnetic sensor is arranged to an inner circumferential surface of the helical excitation coil, and respective magnetic sensors of adjacent two magnetic sensor groups are in one-to-one correspondence.

In some embodiments, the magnetic sensor is a tunnel magnetoresistance sensor.

Additional aspects and advantages of embodiments of present disclosure will be given in part in the following descriptions, become apparent in part from the following descriptions, or be learned from the practice of the embodiments of the present disclosure.

Figure 1:
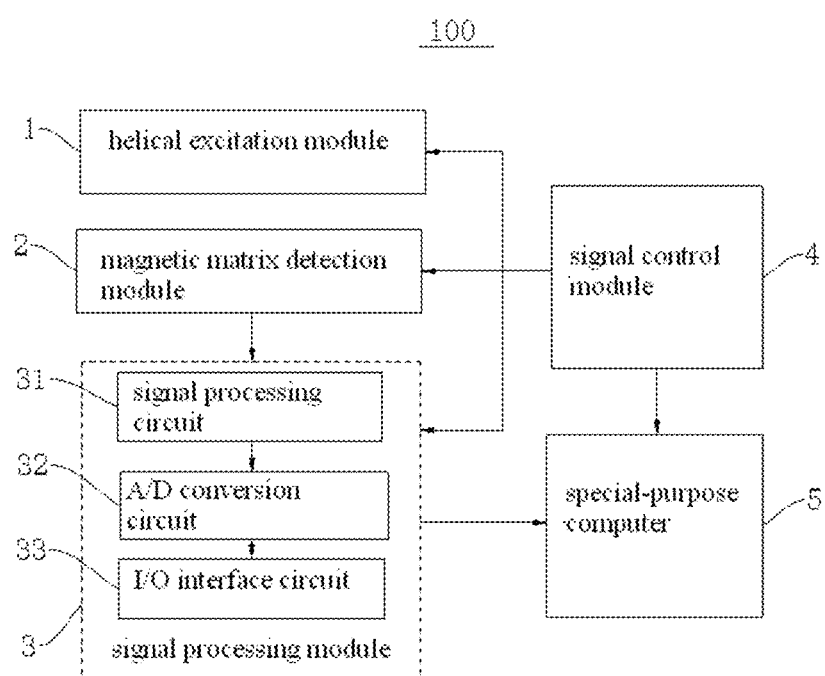
FIG. 1 illustrates a schematic structure block diagram of a high-precision imaging and detecting device for detecting a small defect of a pipeline by a helical magnetic matrix according to an embodiment of the present disclosure.

REFERENCE NUMERALS imaging and detecting device 100,
helical excitation module 1, helical excitation coil 11,
magnetic matrix detection module 2, magnetic sensor group 21, magnetic sensor 211,
signal processing module 3, signal regulation circuit 31, analog-to-digital conversion circuit 32, I/O interface circuit 33, circuit board 34,
signal control module 4, special-purpose computer 5,
pipeline 200, defect 201.

DETAILED DESCRIPTION

Embodiments of the present disclosure will be described in detail and examples of the embodiments will be shown in the accompanying drawing. The same or similar elements and the elements having same or similar functions are denoted by like reference numerals throughout the descriptions. The embodiments described herein with reference to the drawings are explanatory, which aim to illustrate the present disclosure, but shall not be construed to limit the present disclosure.

A high-precision imaging and detecting device 100 for detecting a small defect 201 of a pipeline 200 by a helical magnetic matrix according to embodiments of the present disclosure will be described with reference to FIGS. 1 to 5.

Figure 2:
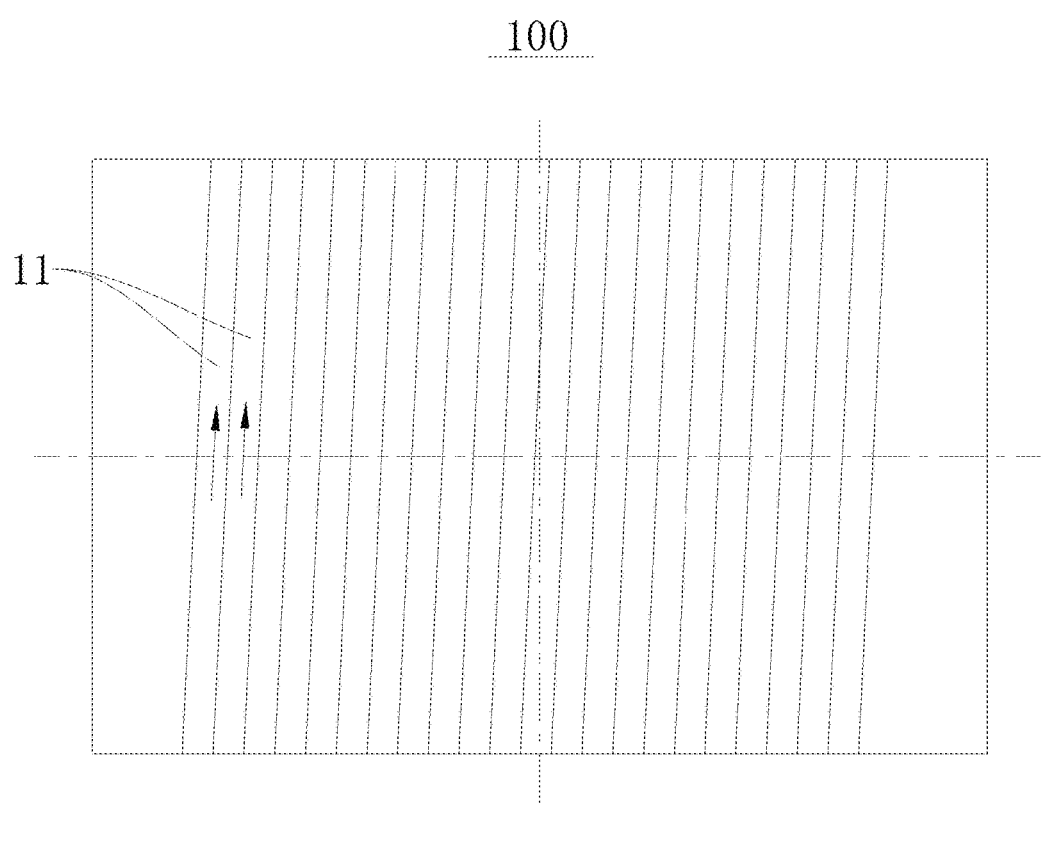
FIG. 2 illustrates a schematic view of a high-precision imaging and detecting device for detecting a small defect of a pipeline by a helical magnetic matrix according to an embodiment of the present disclosure, in which an arrow refers to an excitation current direction.

As shown in FIGS. 1 and 2, the high-precision imaging and detecting device 100 for detecting the small defect 201 of the pipeline 200 by the helical magnetic matrix according to embodiments of the present disclosure includes a helical excitation module 1, a magnetic matrix detection module 2, and a signal processing module 3.

Specifically, the helical excitation module 1 includes a helical excitation coil 11, and the helical excitation coil 11 is a coil extending and wound as a helical line and is configured to induce an alternating current in the pipeline 200. For example, during detection of the pipeline 200, the helical excitation coil 11 is disposed at an inner side of the pipeline 200, preferably abutting against an inner circumferential wall of the pipeline 200 to enhance an excitation effect; when the helical excitation coil 11 is supplied with an alternating current, the helical excitation coil 11 produces an alternating magnetic field, and the alternating magnetic field acts on the pipeline 200 within its range, thus producing an alternating induction current in the pipeline 200. The alternating induction current is distributed along a circumferential direction of the pipeline 200, and in such a case, a direction of the induction current is opposite to a current direction in the helical excitation coil 11. If the defect 201 exists in the pipeline 200 within an alternating current induction area, a current flow path at the location of the defect 201 will change, thereby resulting in a change of an induction magnetic field at the defect 201 of the pipeline 200.

The magnetic matrix detection module 2 is disposed at an inner side of the helical excitation coil 11 (e.g. a side of the helical excitation coil 11 towards its central axis), and the magnetic matrix detection module 2 can include only one magnetic sensor group 21 or include a plurality of magnetic sensor groups 21, the plurality of magnetic sensor groups 21 being spaced apart and arranged along an axial direction of the helical excitation coil 11 (e.g. a front-and-rear direction shown in FIG. 2). Each magnetic sensor group 21 includes a plurality of magnetic sensors 211 spaced apart and arranged along a circumferential direction of the helical excitation coil 11, and each magnetic sensor 211 is configured to detect the induction magnetic field of the pipeline 200.

Preferably, the plurality of magnetic sensors 211 of each magnetic sensor group 21 are evenly spaced apart and arranged along the circumferential direction of the helical excitation coil 11. Thus, the magnetic sensors 211 can be distributed evenly in the circumferential direction of the pipeline, and it is convenient to evenly detect defects in various parts along the circumferential direction of the pipeline, improving detection precision.

Therefore, by providing the plurality of magnetic sensors 211 spaced apart and arranged in the circumferential and axial directions of the pipeline 200, the induction magnetic field in various locations of the pipeline 200 can be collected. When the defect 201 exists in the pipeline 200, the induction magnetic field in its corresponding location will change, and hence the defect 201 of the pipeline 200 can be detected accurately. In short, the magnetic matrix detection module 2 can be used to collect change information of the induction magnetic field at the defect 201 of the pipeline 200.

Preferably, the number of the magnetic sensors 211 in each magnetic sensor group 21 is not less than eight.

The signal processing module 3 is connected with the magnetic matrix detection module 2, and configured to receive, process and output an induction magnetic field signal of the pipeline 200, in which the induction magnetic signal is detected by the magnetic sensor 211. For example, the signal processing module 3 can be used to perform amplification, filtration, effective value conversion, analog-to-digital conversion and signal transmission of the detected signal.

For the high-precision imaging and detecting device 100 for detecting the small defect 201 of the pipeline 200 by the helical magnetic matrix according to embodiments of the present disclosure, by adopting the helical excitation coil 11 as an excitation source, the excitation structure is simpler, and the excitation source is controllable and capable of adapting to detection of pipelines 200 with different wall thicknesses, compared with a conventional permanent-magnet magnetizer used for a magnetic flux leakage testing; by utilizing the magnetic sensors 211 in a matrix arrangement in the magnetic matrix detection module 2 to realize detection of the induction magnetic field, compared with conventional coil-type signal acquisition of eddy-current testing, the defect 201 can be located accurately and imaged based on sufficiently acquired information of the defect 201, and compared with magnetic signal acquisition of the eddy-current testing—arranging a single or a few magnetic sensors in a center of an eddy-current coil to detect an eddy-current change in the magnetic field, the magnetic sensors 211 in the matrix arrangement adopted in the present disclosure can sufficiently obtain the information about the defect 201 even if the defect 201 is very small.

The high-precision imaging and detecting device 100 for detecting the small defect 201 of the pipeline 200 by the helical magnetic matrix according to embodiments of the present disclosure has advantages of a simple structure, convenient operation and high detection precision.

In an embodiment of the present disclosure, the signal processing module 3 includes a signal regulation circuit 31, an analog-to-digital conversion circuit (A/D conversion circuit) 32, and an I/O interface circuit 33. The signal processing module 3 is configured to perform amplification, filtration, analog-to-digital conversion and signal output of the induction magnetic field signal detected by the magnetic sensor 211. Specifically, the signal regulation circuit 31 can amplify and filter the received induction magnetic field signal; the analog-to-digital conversion circuit 32 can convert an analog signal of the induction magnetic field into a digital signal used for data acquisition, process control, calculation execution, display or other purposes; the I/O interface circuit 33 is configured to input and output the induction magnetic field signal.

Further, the signal processing module 3 can also include an effective value conversion circuit that is configured to convert a received alternating current signal of the induction magnetic field of the pipeline 200 into a direct current signal by means of an effective value conversion. That is, the effective value conversion circuit can perform the effective value conversion of the acquired alternating current signal, and obtain the direct current signal that is unaffected by excitation frequency. Thus, the detection precision can be improved and noise signals can be reduced.

Figure 3:
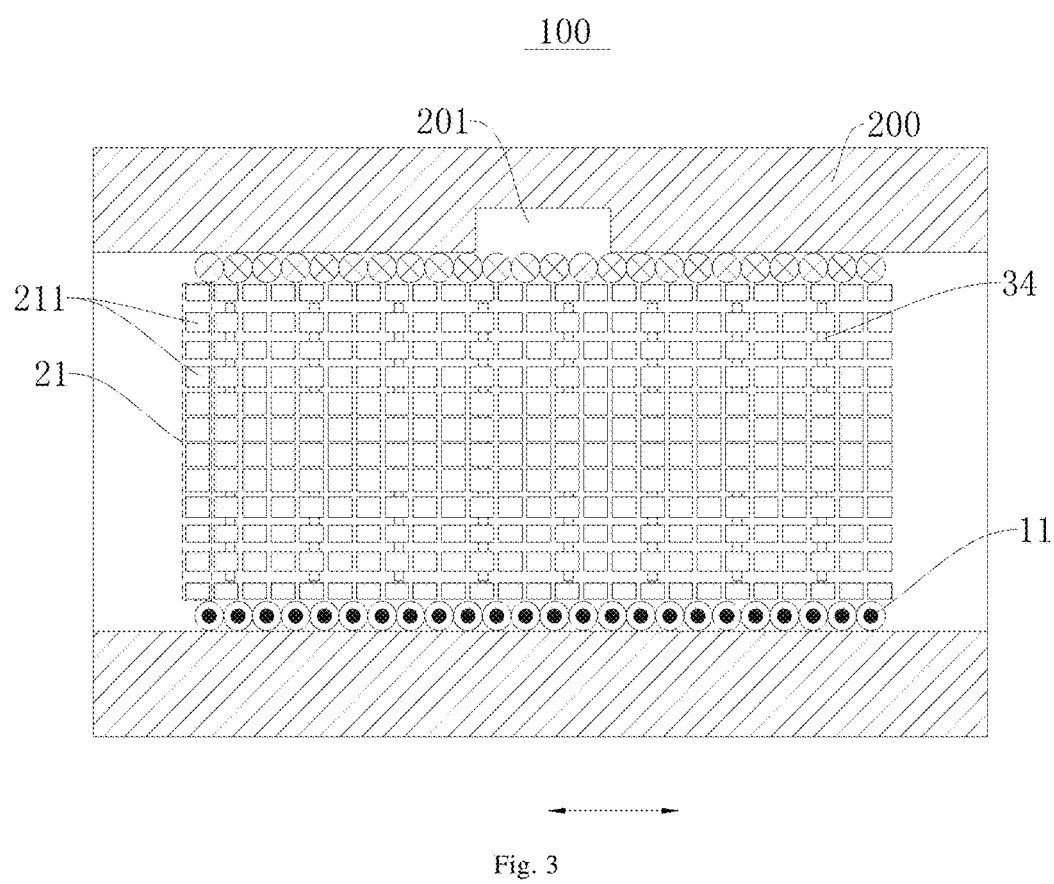
FIG. 3 illustrates an axial sectional view of the imaging and detecting device illustrated in FIG. 2.
Figure 4:
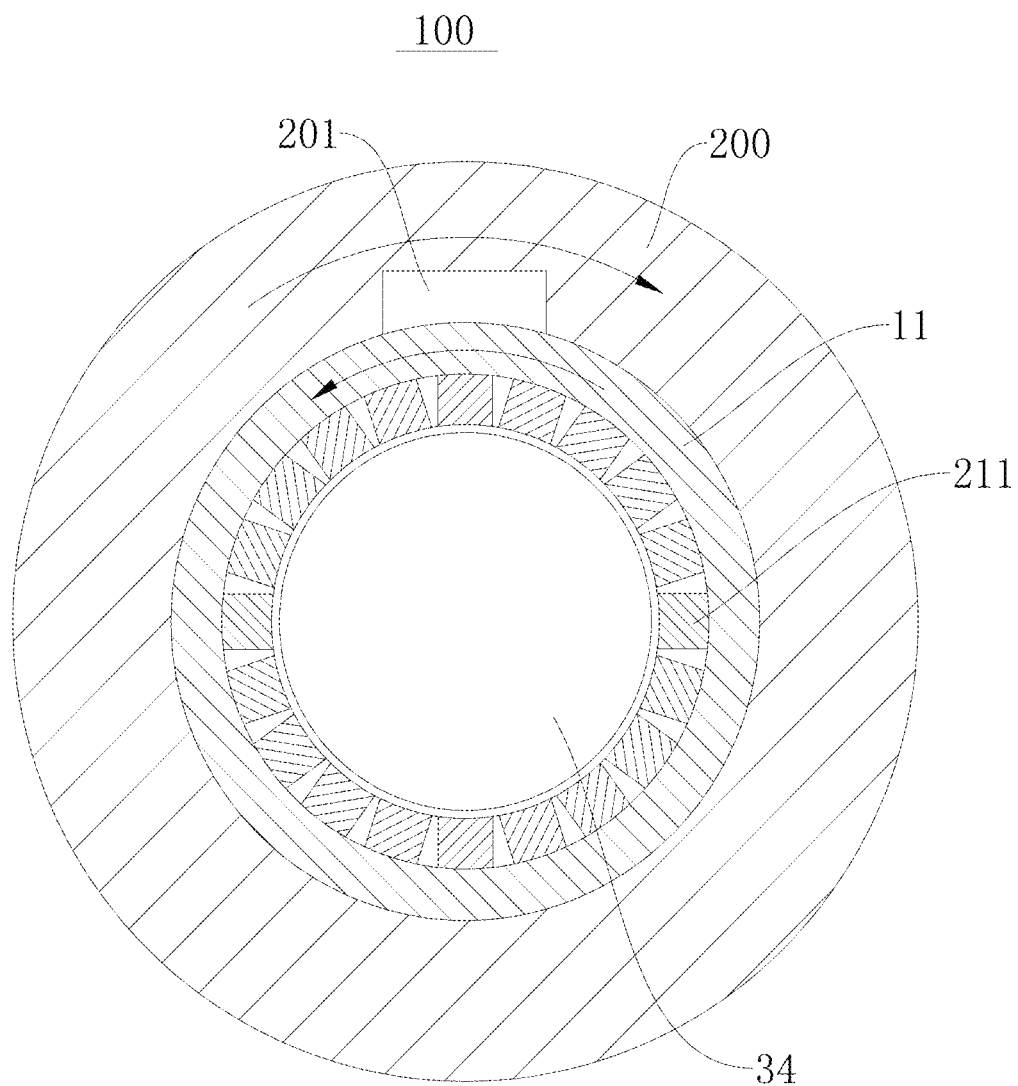
FIG. 4 illustrates a circumferential sectional view of the imaging and detecting device illustrated in FIG. 2, in which an arrow refers to a current direction.

As shown in FIGS. 3 and 4, the high-precision imaging and detecting device 100 for detecting the small defect 201 of the pipeline 200 by the helical magnetic matrix according to embodiments of the present disclosure further includes a circuit board 34, the circuit board 34 is disposed at an inner side of the magnetic matrix detection module 2, and the signal regulation circuit 31, the analog-to-digital conversion circuit 32 and the I/O interface circuit 33 are integrated on the circuit board 34. By providing the circuit board 34, various circuits of the signal processing module 3 are integrated by the circuit board 34, and since the circuit board 34 is disposed at the inner side of the magnetic matrix detection module 2, it is possible to solve problems of complicated layout, too many outgoing lines, crosstalk and other issues that are encountered in the current multi-magnetic sensor detection, thereby saving space effectively and reducing redundancy of a probe and a detection system.

Each circuit board 34 can include only four outgoing lines.

Preferably, the circuit board 34 has a circular plate shape, and the circular circuit board 34 is disposed perpendicular to an axis of the helical excitation coil 11.

Further, one circuit board 34 can be provided, or a plurality of circuit boards 34 can be provided. The plurality of circuit boards 34 are arranged in the axial direction of the helical excitation coil 11 and spaced apart from each other, and each of the circuit boards 34 is connected with the magnetic sensor 211 of at least one magnetic sensor group 21. That is, all the magnetic sensors 211 in one magnetic sensor group 21 are connected to the same circuit board 34, one circuit board 34 can connect at least one magnetic sensor group 21, and this circuit board 34 is used to process induction magnetic field signals detected by all the magnetic sensors 211 of the connected magnetic sensor group 21.

Preferably, each circuit board 34 connects at least two magnetic sensor groups 21. For example, each circuit board 34 can connect three, four, five or more magnetic sensor groups 21. Thus, it is possible to reduce components of the imaging and detecting device 100, improve a utilization rate of the circuit board 34, decrease outgoing lines and save the space.

As shown in FIG. 1, the high-precision imaging and detecting device 100 for detecting the small defect 201 of the pipeline 200 by the helical magnetic matrix according to embodiments of the present disclosure further includes a special-purpose computer 5. The special-purpose computer 5 is connected with the signal processing module 3 and configured to store, analyze, calculate and display the induction magnetic field signal of the pipeline 200 transmitted by the signal processing module 3.

As shown in FIG. 1, in some embodiments, the high-precision imaging and detecting device 100 for detecting the small defect 201 of the pipeline 200 by the helical magnetic matrix further includes a signal control module 4, and the signal control module 4 is connected with the helical excitation module 1, the magnetic matrix detection module 2, the signal processing module 3 and the special-purpose computer 5 separately.

The signal control module 4 can be configured to control the alternating current input into the helical excitation coil 11, so as to control the helical excitation module 1 to produce the excitation source adapted to the wall thickness of the pipeline 200. For example, the signal control module 4 can control the helical excitation module 1 to produce excitation sources of different frequency domains and amplitude values adapted to different pipelines 200 based on wall thicknesses and material properties of the detected pipelines 200.

Further, the signal control module 4 can be configured to control the number of magnetic sensor groups 21 activated in the magnetic matrix detection module 2, so as to control the magnetic matrix detection module 2 to provide different detection modes. For example, it is possible to control only one magnetic sensor group 21 to be activated to realize a single-ring detection mode, or control a plurality of magnetic sensor groups 21 to be activated to realize a torus detection mode with multiple columns of circumferential channels.

Additionally, the signal control module 4 can be further configured to control to transmit a signal of the signal processing module 3 to the special-purpose computer 5, thereby facilitating analysis, process and display by the special-purpose computer 5.

In some embodiments of the present disclosure, the helical excitation coil 11 of the helical excitation module 1 has a fixed axial length, and can provide a source magnetic field when it is energized. During the detection, the helical excitation coil 11 abuts against an inner wall of the pipeline 200 and is supplied with a sinusoidal alternating current with an adjustable frequency, and according to the electromagnetic induction, the alternating current can be induced in the induction area of the pipeline 200.

Preferably, adjacent two turns of wires in the helical excitation coil 11 are fitted closely. That is, adjacent two turns of wires are fitted closely in the axial direction of the helical excitation coil 11. In other words, a pitch of the helical excitation coil 11 is a diameter of the wire. Thus, the helical excitation module 1 can have a more compact structure and the excitation source is enhanced.

Certainly, the present disclosure is not limited thereto, and the adjacent two turns of wires in the helical excitation coil 11 can have a certain space therebetween.

In some embodiments, each magnetic sensor 211 is arranged to an inner circumferential surface of the helical excitation coil 11, and respective magnetic sensors of adjacent two magnetic sensor groups 21 are in one-to-one correspondence. Thus, the arrangement of the magnetic sensors 211 can be normalized, and the matrix arrangement of the magnetic sensors 211 can be realized. As shown in FIGS. 3 and 4, the magnetic matrix detection module 2 adopts the matrix arrangement of the magnetic sensors 211, i.e. the magnetic sensors 211 are arranged in a two-dimensional matrix to an inner wall surface of the helical excitation coil 11, in which an detection row is arranged along the axial direction of the pipeline 200, and an detection column is arranged along the circumferential direction of the pipeline 200. That is to say, the detection row is parallel to the axial direction of the pipeline 200, and the detection column surrounds the axial direction of the pipeline 200.

In some embodiments, the magnetic sensor 211 is a tunnel magnetoresistance (TMR) sensor. The magnetic sensor 211 is configured as a special TMR sensor, and arranged in the form of the two-dimensional matrix to an inner side of the axial helical excitation coil 11, and a dynamic response frequency range that can be detected reaches up to 1 MHz.

The high-precision imaging and detecting device 100 for detecting the small defect 201 of the pipeline 200 by the helical magnetic matrix according to embodiments of the present disclosure can travel along an extension direction of the pipeline 200 during the detection in the pipeline 200, so as to facilitate continuous detection of the defects 201 of the entire pipeline 200.

The high-precision imaging and detecting device 100 for detecting the small defect 201 of the pipeline 200 by the helical magnetic matrix according to a specific embodiment of the present disclosure will be described with reference to FIGS. 1 to 3.

As shown in FIG. 1, the present disclosure provides the high-precision imaging and detecting device 100 for detecting the small defect 201 of the pipeline 200 by the helical magnetic matrix. The imaging and detecting device 100 includes the helical excitation module 1, the magnetic matrix detection module 2, the signal processing module 3, the signal control module 4 and the special-purpose computer 5.

The helical excitation module 1 employs the helical excitation coil 11 configured to induce the alternating current distributed along the circumferential direction of the pipeline 200 in the alternating current induction area of the pipeline 200. Specifically, as shown in FIGS. 2 to 4, the helical excitation module 1 adopts the helical excitation coil 11 with the fixed axial length to supply the source magnetic field. A circumferential length of the helical excitation coil 11 is 150 mm, a ring into which the coils are wound has a diameter of 138 mm, viewed from a traveling direction of the imaging and detecting device 100, the helical excitation coil 11 is wound in a counterclockwise direction and turns of wires of the helical excitation coil 11 are wound tightly, and the helical excitation coil 11 abuts against the inner wall of the pipeline 200. A sinusoidal alternating current signal having a frequency of 4.5 kHz and an amplitude value of 1.2V is supplied to the helical excitation coil 11, the alternating current can induce an alternating magnetic field in space, and according to the principle of the electromagnetic induction, the alternating current can be further induced in the induction area of the pipeline 200.

A defect detection principle is presented as follows. In the alternating current induction area, the induction current is distributed along the circumferential direction of the pipeline 200, and the direction of the induction current is opposite to the current direction in the excitation coil 11; when there is a defect 201 in the alternating current induction area, the current flow path will change, thereby resulting in the change of the induction magnetic field at the defect 201 of the pipeline 200. By detecting the induction magnetic field at the defect 201 and grasping its change trend, the defect 201 of the pipeline 200 can be imaged and detected.

The magnetic matrix detection module 2 employs the matrix arrangement of the magnetic sensors 211 to collect the change information of the induction magnetic field at the defect 201 of the pipeline 200. Specifically, as shown in FIGS. 2 to 4, the magnetic sensors 211 are arranged in a 24×36 two-dimensional matrix to the inner wall surface of the pipeline 200, the matrix of the magnetic sensors 211 includes 24 detection rows along the axial direction of the pipeline 200 (i.e. the traveling direction of the imaging and detecting device 100) and 36 detection columns along the circumferential direction of the pipeline 200, that is to say, 24 detection rows are parallel to the axial direction of the pipeline 200, and 36 detection columns surround the axial direction of the pipeline 200. In the detection rows and detection columns, all the magnetic sensors 211 are arranged at equal intervals. The magnetic sensor 211 is configured as the special TMR sensor, and arranged in the form of the two-dimensional matrix to the inner side of the axial helical excitation coil 11, and the dynamic response frequency range that can be detected reaches up to 1 MHz.

The signal processing module 3 includes the signal regulation circuit 31, the A/D circuit, and the I/O interface circuit 33, and is configured to perform amplification, filtration, effective value conversion, analog-to-digital conversion and signal transmission of the detected signal. Specifically, a two-stage amplifying circuit composed of two operational amplifiers AD8220 is utilized, and the first stage has an amplification of 50 times while the second stage has an amplification of 100 times; a four-stage filtering circuit composed of one operational amplifier LTC1562 is adopted; the effective value conversion circuit is built up to perform the effective value conversion of the acquired alternating current signal, so as to obtain the direct current signal that is unaffected by the excitation frequency. The analog-to-digital conversion circuit 32 utilizes a chip ADS7883 to convert the analog signal into the digital signal, and conduct data transmission between modules by means of RS485 communication protocol.

Meanwhile, the circular circuit boards 34 distributed along a section of the pipeline 200 are adopted to integrate the signal regulation circuit 31, the analog-to-digital conversion circuit 32 and the I/O interface circuit 33 of the signal processing module 3. As illustrated in FIGS. 3 and 4, the circular circuit boards 34 are arranged to an inner side of the array of the magnetic sensors 211, and each circular circuit board 34 can be responsible for process and transmission of the acquired signals of three rings of magnetic sensors 211 (i.e. 72 magnetic sensors); there are 12 circular circuit boards 34 in total arranged to the inner side of the magnetic sensors 211, and each circular circuit board 34 has only four outgoing lines. The circuit board 34 is used to integrate critical components of the signal processing module 3, saving the space effectively and reducing the redundancy of the probe and the detection system.

The signal control module 4 is connected with the helical excitation module 1, the magnetic matrix detection module 2, the signal processing module 3 and the special-purpose computer 5 separately, and is configured to control the helical excitation module 1 to produce the excitation source adapted to the wall thickness of the pipeline 200, control the detection mode of the magnetic matrix detection module 2, and transmit the signal that has passed through the signal processing module 3 to the special-purpose computer 5 for analysis, process and display.

Specifically, the signal control module 4 is connected with the helical excitation module 1, and controls the helical excitation module 1 to produce excitation sources of different frequency domains and amplitude values adapted to different pipelines 200. In this embodiment, the excitation source has a frequency of 4.5 kHz and an amplitude value of 1.6V.

The signal control module 4 is connected with the magnetic matrix detection module 2, and controls the magnetic matrix detection module 2 to provide different detection modes, including the single-ring detection mode using a single column of circumferential channel, and the torus detection mode using multiple columns of circumferential channels, in which the single-ring detection mode can select any one column of circumferential detection channel to perform the detection, and the torus detection mode can select two or more circumferential detection channels to perform the detection. In this embodiment, the torus detection mode is adopted, and all the detection channels are selected for detection, i.e. data collection is performed on various detection channels in the 24×36 magnetic detection array.

The signal control module 4 is connected with the signal processing module 3, and controls the signal processing module 3 to regulate, convert, buffer and transmit the acquired signal; the signal control module 4 is connected with the special-purpose computer 5, and a control command is transmitted to the signal control module 4 by the special-purpose computer 5 and then transmitted by the signal control module 4 to the helical excitation module 1, the magnetic matrix detection module 2 and the signal processing module 3 for processing.

Figure 5:
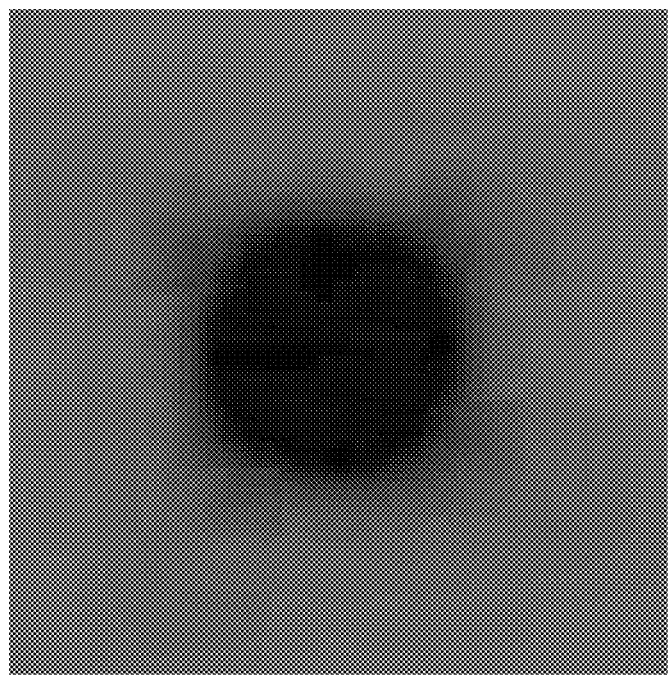
FIG. 5 illustrates a schematic diagram of a defect of a pipeline detected and imaged by a high-precision imaging and detecting device for detecting a small defect of a pipeline by a helical magnetic matrix according to an embodiment of the present disclosure.

The special-purpose computer 5 is configured to store, analyze, calculate and display the collected and processed signal. For example, the collected and processed signal is transmitted to the special-purpose computer 5, and the detected defect 201 is finally displayed as shown in FIG. 5 after the analysis and calculation.

The high-precision imaging and detecting device 100 for detecting the small defect 201 of the pipeline 200 by the helical magnetic matrix according to embodiments of the present disclosure adopts the helical excitation coil 11 to provide the excitation source, effectively saving the device volume and simplifying the device structure, and adopts the magnetic sensors 211 in the matrix arrangement, improving the amount of detection information compared with the conventional eddy-current testing, and realizing high-precision imaging and detection of the defect 201. The high-precision imaging and detecting device 100 for detecting the small defect 201 of the pipeline 200 by the helical magnetic matrix according to the present disclosure has advantages of simple operation and high detection precision.

In the specification, it is to be understood that terms such as "central," "longitudinal," "lateral," "length," "width," "thickness," "upper," "lower," "front," "rear," "left," "right," "vertical," "horizontal," "top," "bottom," "inner," "outer," "clockwise," "counterclockwise," "axial," "radial" and "circumferential" should be construed to refer to the orientation as then described or as shown in the drawings under discussion. These relative terms are for convenience of description and do not require that the present disclosure be constructed or operated in a particular orientation, and hence cannot be constructed to limit the present disclosure.

In addition, terms such as "first" and "second" are used herein for purposes of description and are not intended to indicate or imply relative importance or significance or to imply the number of indicated technical features. Thus, the feature defined with "first" and "second" may comprise one or more of this feature. In the description of the present disclosure, "a plurality of" means two or more than two, unless specified otherwise.

In the present disclosure, unless specified or limited otherwise, the terms "mounted," "connected," "coupled," "fixed" and the like are used broadly, and may be, for example, fixed connections, detachable connections, or integral connections; may also be mechanical or electrical connections; may also be direct connections or indirect connections via intervening structures; may also be inner communications of two elements, which can be understood by those skilled in the art according to specific situations.

Reference throughout this specification to "an embodiment," "some embodiments," "an example," "a specific example," or "some examples," means that a particular feature, structure, material, or characteristic described in connection with the embodiment or example is included in at least one embodiment or example of the present disclosure. Thus, the appearances of the phrases in various places throughout this specification are not necessarily referring to the same embodiment or example of the present disclosure. Furthermore, the particular features, structures, materials, or characteristics may be combined in any suitable manner in one or more embodiments or examples.

Although explanatory embodiments have been shown and described, it would be appreciated by those skilled in the art that changes, modifications, alternatives and variants can be made in the embodiments without departing from principles and purposes of the present disclosure. The protection scope of the present disclosure is defined by the claims or the like.

What is claimed is:

1. A high-precision imaging and detecting device for detecting a small defect of a pipeline by a helical magnetic matrix, comprising:
   a helical excitation module, comprising a helical excitation coil, the helical excitation coil being configured to induce an alternating current in the pipeline;

a magnetic matrix detection module, disposed at an inner side of the helical excitation coil and comprising one magnetic sensor group or comprising a plurality of magnetic sensor groups spaced apart and arranged along an axial direction of the helical excitation coil, each magnetic sensor group comprising a plurality of magnetic sensors evenly spaced apart and arranged along a circumferential direction of the helical excitation coil, and each magnetic sensor being configured to detect an induction magnetic field of the pipeline; and a signal processing module, connected with the magnetic matrix detection module, and configured to receive, process and output an induction magnetic field signal of the pipeline detected by the magnetic sensor.

2. The high-precision imaging and detecting device according to claim 1, wherein the signal processing module comprises a signal regulation circuit, an analog-to-digital conversion circuit, and an I/O interface circuit, and the signal processing module is configured to perform amplification, filtration, analog-to-digital conversion and signal output of the induction magnetic field signal detected by the magnetic sensor.

3. The high-precision imaging and detecting device according to claim 2, wherein the signal processing module further comprises an effective value conversion circuit that is configured to convert a received alternating current signal of the induction magnetic field of the pipeline into a direct current signal by means of an effective value conversion.

4. The high-precision imaging and detecting device according to claim 2, further comprising: a circuit board disposed at an inner side of the magnetic matrix detection module, the signal regulation circuit, the analog-to-digital conversion circuit and the I/O interface circuit being integrated on the circuit board.

5. The high-precision imaging and detecting device according to claim 4, wherein one or a plurality of circuit boards are provided, the plurality of circuit boards are spaced apart and arranged along the axial direction of the helical excitation coil, and each circuit board is connected with the magnetic sensor of at least one magnetic sensor group.

6. The high-precision imaging and detecting device according to claim 1, further comprising:

a special-purpose computer, connected with the signal processing module and configured to store, analyze, calculate and display the induction magnetic field signal of the pipeline transmitted by the signal processing module; and a signal control module, connected with the helical excitation module, the magnetic matrix detection module, the signal processing module and the special-purpose computer separately, and configured to control an alternating current input into the helical excitation coil, control the number of magnetic sensor groups activated in the magnetic matrix detection module, and control transmission of a signal of the signal processing module to the special-purpose computer.

7. The high-precision imaging and detecting device according to claim 1, wherein each magnetic sensor is arranged to an inner circumferential surface of the helical excitation coil, and respective magnetic sensors of adjacent two magnetic sensor groups are in one-to-one correspondence.

8. The high-precision imaging and detecting device according to claim 1, wherein the magnetic sensor is a tunnel magnetoresistance sensor.

* * * * *